United States Patent [19]

Havemann

[11] Patent Number: 4,943,536
[45] Date of Patent: Jul. 24, 1990

[54] TRANSISTOR ISOLATION

[75] Inventor: Robert H. Havemann, Garland, Tex.

[73] Assignee: Texas Instruments, Incorporated, Dallas, Tex.

[21] Appl. No.: 200,395

[22] Filed: May 31, 1988

[51] Int. Cl.[5] ............... H01L 21/265; H01L 21/76
[52] U.S. Cl. .................................... 437/28; 437/33; 437/37; 437/59; 437/63; 437/70; 437/941; 437/953
[58] Field of Search ............... 437/28, 33, 37, 59, 437/63, 941, 953, 70; 148/DIG. 18

[56] References Cited

U.S. PATENT DOCUMENTS

| | | | |
|---|---|---|---|
| 4,494,304 | 1/1985 | Yoshioka | 357/23.11 |
| 4,536,945 | 8/1985 | Gray et al. | 437/59 |
| 4,546,534 | 10/1985 | Nicholas | 437/229 |
| 4,637,125 | 1/1987 | Iwasaki et al. | 437/59 |
| 4,721,686 | 1/1988 | Contiero et al. | 437/31 |
| 4,818,720 | 4/1989 | Iwasaki | 437/58 |
| 4,825,275 | 4/1989 | Tomassetti | 357/43 |
| 4,826,780 | 5/1989 | Takemoto et al. | 437/37 |

FOREIGN PATENT DOCUMENTS

| | | | |
|---|---|---|---|
| 0097379 | 1/1984 | European Pat. Off. | 437/59 |
| 0250721 | 1/1988 | European Pat. Off. | 357/43 |
| 58-171853 | 10/1983 | Japan | 357/43 |
| 62-299058 | 12/1987 | Japan | 357/43 |

Primary Examiner—Olik Chaudhuri
Attorney, Agent, or Firm—Douglas A. Sorensen; James T. Comfort; Melvin Sharp

[57] ABSTRACT

A BICMOS semiconductor device (20) and method for its fabrication is disclosed. Bipolar, PMOS, and NMOS transistors (22, 26, and 28) are isolated from one another by a P type channel stop (54) implantation step prior to formation of a field oxide (56). An N type channel stop (64) implantation step occurs after the field oxide (56) formation. In addition, the N type channel stop (64) implantation step utilizes the same mask as is used to implant N dopant which forms a deep collector region (62) for the bipolar transistor (22).

19 Claims, 2 Drawing Sheets

TRANSISTOR ISOLATION

TECHNICAL FIELD OF THE INVENTION

The present invention relates generally to semiconductor devices. More specifically, the present invention relates to the fabrication of NMOS, PMOS and bipolar transistors and to isolating such transistors from one another.

BACKGROUND OF THE INVENTION

In manufacturing semiconductor devices, care is taken to ensure that parasitic transistors do not activate under normal operating conditions. A parasitic transistor is an unwanted transistor located at adjacent active device regions. In particular, a parasitic thick field MOSFET is formed when the silicon interfacial layer underlying the field oxide insulator is inverted, either from unwanted dopants of opposite conductivity type to the bulk region residing at the interface, or by formation of a channel region (MOSFET) due to voltages on poly or metal leads formed on top of the field oxide. For example, parasitic thick field MOSFET transistors in CMOS or BiCMOS semiconductor devices may be found between N+ moats of adjacent NMOS devices, which have a P− well region therebetween; between an N+ moat and a nearby N− well, which may have a P− well therebetween; between P+ moats of adjacent PMOS devices, which have an N− well region therebetween, or between a P+ moat and a nearby P− well, which may have a N− well region therebetween. In each case, electrical fields created by signals on conductors overlying such parasitic transistors may potentially invert "parasitic channels" and cause such parasitic transistors to conduct.

Various techniques are known to those skilled in the art for ensuring that such parasitic transistors do not activate under normal operating conditions. For example, the further apart active, nonparasitic, transistors are from one another, or the more vertically spaced apart a conductive region is from a parasitic channel, the less likely it is for a parasitic transistor to activate. However, it is desirable in the manufacture of semiconductor devices to compact more nonparasitic, active transistors into a smaller area. Consequently, the isolation problem becomes more acute as semiconductor device density increases.

Some manufacturing processes currently use a P type channel stop implant to help deactivate parasitic transistors. When an oxide layer, such as a field oxide, is thermally grown over parasitic channel region, a portion of the P dopant in the parasitic channel region tends to segregate into the oxide and thereby deplete the P doping of the parasitic channel region under the oxide. This depleted region can easily be inverted by signals present on overlying conductive layers because it is lightly doped after the segregation of P type dopant into the oxide. Consequently, the P type channel stop implant is configured to add a quantity of P type dopant into such regions to compensate for the depletion. The increased dopant causes the threshold voltage associated with the parasitic channel to increase and the parasitic transistor to remain substantially deactivated under normal operating conditions.

This P channel stop implant may also be implanted into N well regions to simplify fabrication of CMOS devices. N type dopant, in contrast to P type dopant, tends to "pile-up" at the substrate surface where a field oxide is thermally grown. This pile-up phenomenon increases the concentration of N type dopant at this surface. The small dosage of P type channel stop dopant conventionally implanted in the N well regions does not significantly compensate this piled-up region. Therefore, a conventional parasitic transistor having this piled-up N well region as a parasitic channel tends to remain substantially deactivated during normal operating conditions.

However, as device geometries shrink, the effectiveness of this pile-up region in deactivating such a parasitic transistor diminishes because there is less pile-up. With smaller geometries, a greater dosage of P type channel stop dopant may be used to deactivate parasitic transistors having P type parasitic channel regions. As this P type channel stop dopant is simultaneously implanted into N well regions, it tends to more completely compensate the N dopant in the N well regions in spite of the pile up phenomenon. Consequently, lowered threshold voltage is required to invert this N type region. Moreover, as device geometries shrink, the thickness of field oxide regions shrinks as well. As the field oxide thickness shrinks, conductors overlying the field oxide region tend to reside closer to the parasitic channel region. Electric fields resulting from signals on such conductors increase in this N type region, and therefore, greater threshold voltages are present to invert the N region and form a P type parasitic channel.

One solution to this isolation problem could be to block implantation of P type channel stop dopant into N type well regions. However, this solution is undesirable because it requires the use of an additional masking step. Consequently, a need exists for a method of isolating active transistors from one another without adding masking steps.

SUMMARY OF THE INVENTION

Accordingly, it is an advantage of the present invention that an improved semiconductor device fabrication process is provided which isolates active transistors from one another without increasing the required number of masking steps.

Another advantage of the present invention is that a BiCMOS or Bipolar fabrication process is provided which introduces an N type dopant into N well regions to serve as a channel stop.

The above and other advantages of the present invention are carried out in one form by a method of manufacturing a semiconductor device in which first and second well regions are formed in the semiconductor device adjacent to one another. The first well region exhibits a first conductivity type and the second well region exhibits a second conductivity type. A first dopant of the first conductivity type is introduced into portions of both the first and second well regions. Next, a field insulating region is formed overlying the first portions of the first and second well regions. A second dopant is next introduced into the first portion of the second well region. This second dopant is of the second conductivity type, and the introduction of the second dopant occurs through the field insulating region.

BRIEF DESCRIPTION OF THE DRAWINGS

A more complete understanding of the present invention may be derived by referring to the detailed description and claims when considered in connection with the FIGURES, wherein like references numbers refer to similar items throughout the FIGURES, and:

DETAILED DESCRIPTION OF THE PREFERRED EMBODIMENT

Figure 1:
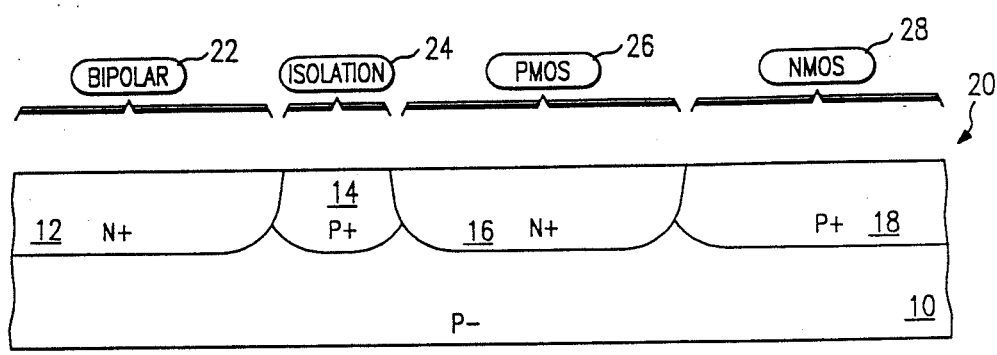
FIG. 1 shows a schematic, cross-sectional side view of the present invention at a first stage of fabrication.

FIG. 1 shows a first stage in the fabrication of the present invention. In FIG. 1 a monocrystalline silicon substrate 10 has been lightly doped with a P dopant so that a P dopant concentration on the order of less than 1E15 atoms/cm$^3$ results Into substrate 10, an N+ doped subcollector region 12 has been formed along with a P doped region 14, an N+ doped region 16, and a P doped region 18. As shown in FIG. 1, region 14 resides between regions 12 and 16, and region 16 resides between regions 14 and 18. Substrate 10 and regions 12-18 therein are formed using conventional techniques. In the preferred embodiment of the present invention, subcollector region 12 and N+ region 16 each exhibit a concentration of N dopant on the order of 1E20 atoms/cm$^3$. P regions 14 and 18 exhibit a concentration of P dopant on the order of 1E16 to 1E17 atoms/cm$^3$. After future fabrication steps, a bipolar transistor 22 resides in and above the region occupied by subcollector 12. An isolation region 24 resides in and above P region 14, a PMOS transistor 26 overlies N+ region 16, and an NMOS transistor 28 overlies P region 18.

Figure 2:
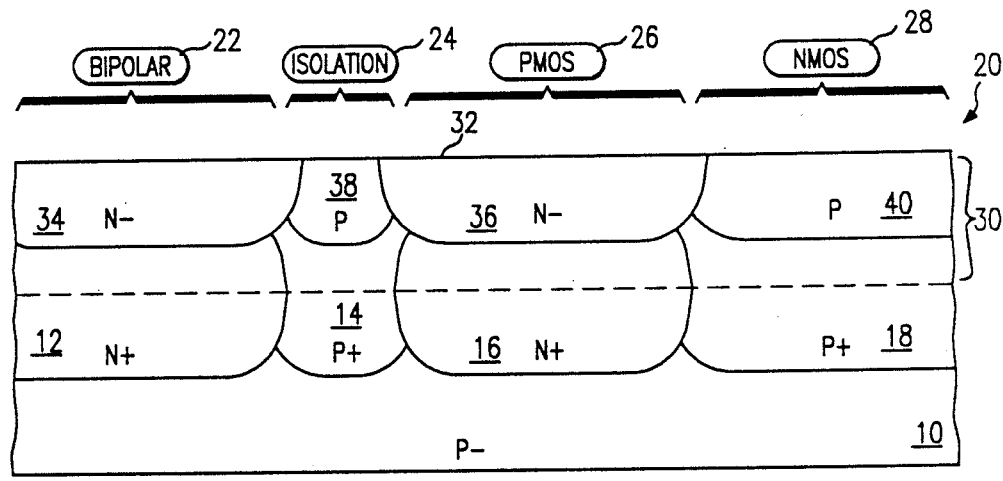
FIG. 2 shows a schematic, cross-sectional side view of the present invention at a second stage of fabrication.

FIG. 2 shows a semiconductor device 20, which includes substrate 10, at a second stage in the fabrication process. The present process performs several process steps to the structure shown in FIG. 1 before it resembles the structure shown in FIG. 2. For example, an epitaxial layer 30 is grown overlying regions 12-18 of substrate 10. In the preferred embodiment, epitaxial layer 30 is a monocrystalline silicon layer, which is on the order of 1.0 to 1.5 microns thick. Subsequent to the formation of epitaxial layer 30, a thin oxide layer (not shown) is grown on a substrate surface 32 of epitaxial layer 30. Next, the present process deposits a nitride layer (not shown) over the oxide layer. These nitride and oxide layers are not shown in FIG. 2 because they are removed later. After the deposition of the nitride layer, the process patterns and etches the nitride and oxide layers to expose surface 32 overlying N— well regions 34 and 36. N— well region 34 resides in bipolar transistor area 22, and N— well region 36 resides in PMOS transistor area 26.

The process of fabricating the present invention next performs a conventional ion implantation step to introduce phosphorous into well regions 34 and 36. After this implantation process, an N well oxide (not shown) is thermally grown overlying regions 34 and 36, self-aligned to the nitride mask which was discussed above. This N well oxide is sufficiently thick so that it prevents passage of boron ions in a subsequent implantation step. After the N well oxide has been grown, the nitride is stripped and an implantation step introduces boron into P well regions 38 and 40. P well region 38 resides in isolation area 24, and P well region 40 resides in NMOS transistor area 28. After implantation of the boron, N— wells 34 and 36 and P wells 38 and 40 are driven in using conventional techniques. As a result, wells 34-40 each exhibit a concentration on the order of 1E16-3E16 atoms/cm$^3$ and extend approximately 1 micron beneath substrate surface 32. As shown in FIG. 2, the driving in step causes subcollector 12 and regions 14-18 to up-diffuse a small distance into epitaxial layer 30. Next, the present process removes the N well oxide and thin oxide layer from surface 32, and a structure substantially as shown in FIG. 2 remains (steps in silicon surface due to N well oxidation are not shown for simplicity).

Figure 3:
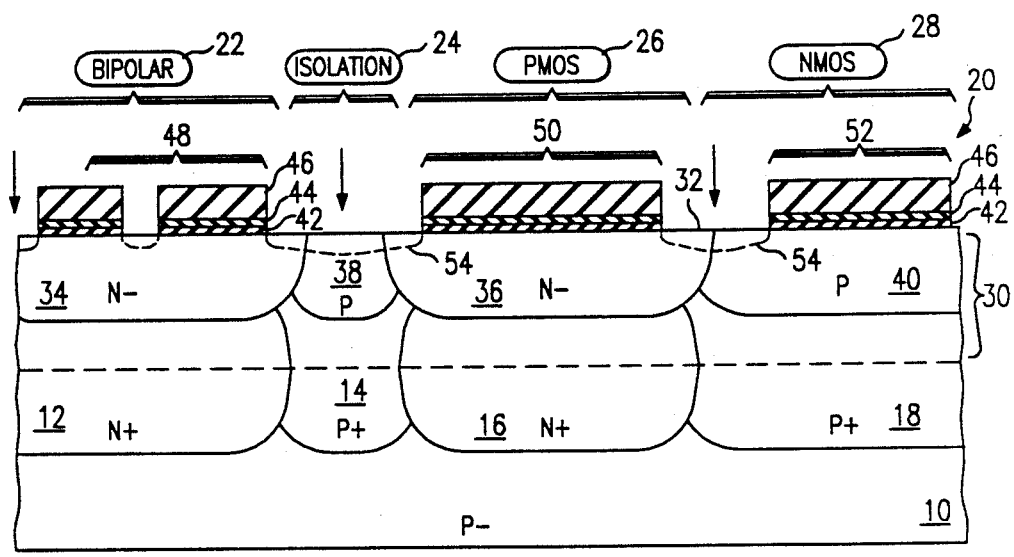
FIG. 3 shows a schematic, cross-sectional side view of the present invention at a third stage of fabrication.

The structure shown in FIG. 2 is prepared for process steps which specifically address the isolation of bipolar transistor 22 from P well 38, PMOS transistor 26 from P well 38, and PMOS transistor 26 from NMOS transistor 28. FIG. 3 shows a third stage in the fabrication of semiconductor device 20 that illustrates some of these isolation techniques. To the structure shown in FIG. 2, the present process forms an oxide layer 42 on surface 32. Oxide layer 42 represents a conventional thin oxide which has been thermally grown. The process next deposits a nitride layer 44 overlying oxide layer 42, and a photoresist layer 46 overlying nitride layer 44. After the formation of layers 42-46, layers 42-46 are patterned and etched so that surface 32 is exposed overlying regions of semiconductor device 20 in which a field oxide will be formed in a subsequent processing step. In other words, layers 42-46 remain overlying a base region 48 of bipolar transistor 22, a moat region 50 of PMOS transistor 26, and a moat region 52 of NMOS transistor 28. The exposed regions of surface 32 encompass the junctions between wells 34-40.

Next, a boron channel stop implant occurs over the entire surface of semiconductor device 20. This implantation step uses a relatively low dose, on the order of 5E12 to 1E13 atoms/cm$^2$, and a relatively low energy level, which may advantageously be set at less than 50 Kev. During this channel stop implantation step, layers 42-46 are sufficiently thick to block passage of boron ions. Consequently, channel stop regions 54 are formed at surface 32 of semiconductor device 20, as illustrated in FIG. 3 by the areas enclosed between surface 32 and dotted lines. The dosage used for this channel stop is normally sufficiently low so that the character of wells 34-40 is not altered. In other words, N— wells 34 and 36 remain substantially N— regions within the intersection between wells 34 or 36 and regions 54. However, if the channel stop dosage is high enough, the N well regions will be inverted. The P type dopant concentration in P wells 38 and 40 is not substantially increased within regions 54.

Figure 4:
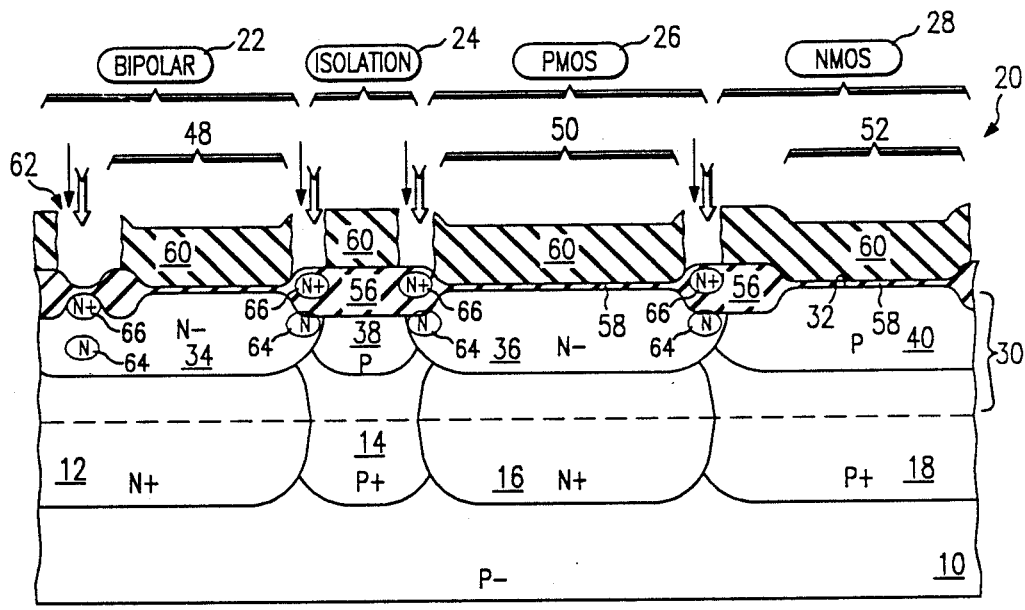
FIG. 4 shows a schematic, cross-sectional side view of the present invention at a fourth stage of fabrication.

FIG. 4 shows a fourth stage in the fabrication of semiconductor device 20. The present process strips photoresist layer 46 from semiconductor device 20, and grows field oxide regions 56 overlying channel stop regions 54 using conventional techniques (see FIG. 3). In the preferred embodiment of the present invention, field oxide regions 56 achieve a thickness of around 5,000-8,000 angstroms. However, this thickness depends upon other geometries of semiconductor device 20.

Boron atoms present in P regions 38 and 40 tend to segregate away from regions 38 and 40, into field oxide regions 56, as regions 56 are grown. This segregation tends to deplete the P doping in the area where field oxide region 56 shares a boundary with regions 38 and 40. However, the boron channel stop implantation step discussed above in connection with FIG. 3 adds a sufficient quantity of boron into this region so that after the segregation a concentration of P dopant near the boundary of field oxide regions 56 in P wells 38 and 40 remains substantially the same as the concentration of P dopant in other areas of P wells 38 and 40.

On the other hand, the phosphorous N dopant contained in N— wells 34 and 36 tends to pile up at the boundaries between wells 34 and 36 and field oxide regions 56. This pile-up tends to slightly increase the concentration of N dopant near the boundaries between wells 34 and 36 and field oxide regions 56. However, the boron channel stop implantation step discussed above in connection with FIG. 3 additionally introduces P dopant in this boundary region, and the P dopant tends to compensate the piled-up N dopant. Thus, the process of the present invention performs steps which introduce additional N dopant into this boundary region. This additional N dopant ensures that the boundary region does not become so lightly doped that it easily inverts under normal operating conditions, causing parasitic transistors to activate.

After the formation of field oxide regions 56, the present process removes nitride layer 44 and oxide layer 42 from surface 32 in regions 48–52 (see FIG. 3), and forms a dummy oxide layer 58 overlying surface 32. Dummy oxide layer 58 is a relatively thin oxide which may be either grown or deposited in the preferred embodiment. Its purpose is primarily to protect surface 32 of epitaxial layer 30 from damaging effects which subsequent processing steps might otherwise cause.

After the formation of oxide layer 58, the present process applies a photoresist layer 60. Photoresist 60 represents a mask having a pattern with voids in a deep collector area 62 of bipolar transistor 22 and along outer edges of N— wells 34 and 36. In addition, voids should also reside between P moat regions (not shown) if more than one P moat resides in an N well. In other words, photoresist 60 overlies at least all of base area 48, all of isolation area 24, moat area 50 of PMOS transistor 26, and all of NMOS transistor 28. Next, an N type, phosphorous channel stop implantation step occurs. The phosphorous dopant in this implantation step is completely blocked by photoresist 60, but is implanted at a sufficiently high energy level that at least a portion of the implanted dosage travels through field oxide regions 56 to reside in N— wells 34 and 36 at the boundaries with field oxide regions 56. Since field oxide regions 56 are in the order of 5,000–8,000 angstroms thick in the preferred embodiment, the energy level utilized for this implantation step is relatively high, such as 350 Kev or more. This implantation step also introduces phosphorous dopant into deep collector region 62 of bipolar transistor 22. The dopant is implanted fairly far beneath surface 32 in deep collector region 62 due to the relatively high energy level used. Thus, this implantation step forms N regions 64, shown in FIG. 4.

The dosage used for this phosphorous channel step implantation step is selected so that the quantity of N— dopant present at the boundary between field oxide regions 56 and N— wells 34 and 36 substantially compensates for any P channel stop dopant implanted in these regions earlier during the P channel stop implantation step discussed above in connection with FIG. 3. Thus, in the preferred embodiment a dosage of around 3E12–8E12 atoms/cm$^2$ is anticipated as being acceptable when the peak of the dopant distribution resides precisely at the boundary between a field oxide region 56 and an N— well 34 or 36.

However, both the dosage and energy level for this channel stop implantation step may be adjusted to compensate for equipment capabilities and field oxide thickness. For example, equipment capable of achieving implantation at energy levels sufficiently high to cause the N dopant to be injected completely through field oxide layers 56 may not be available. In such a situation, the dosage may be slightly increased and a lesser amount of energy may advantageously be used so that a leading tail of the distribution of implanted dopant reaches N— wells 34 and 36 in sufficient quantities to compensate for the P channel stop dopant discussed above. In this situation, a majority of the implantation may be consumed within field oxide regions 56. The implantation of this N type channel stop dopant into deep collector region 62 does no harm to the deep collector region 62, in fact it increases the quantity of dopant in that region and aids in the formation of deep collector 62 in subsequent steps.

After the N type dopant channel stop implantation step, an N type dopant deep collector implantation step occurs using mask 60 as discussed above. The deep collector implantation step introduces a relatively large dosage of N type dopant at a relatively low energy level. The preferred embodiment contemplates the use of phosphorus at around a 1E16 atoms/cm$^2$ dosage and an energy level of around 100–150 Kev or less depending on the thicknesses of field oxide regions 56. This deep collector implantation step forms N+ regions 66, shown in FIG. 4. In deep collector 62, N+ region 66 resides in N— well 34 near surface 32. However, in all other regions where N dopant from this deep collector implantation step is not blocked by mask 60, substantially the entire dosage is consumed in field oxide regions 56. The consumption of region 66 in field oxide regions 56 forces the N dopant from this deep collector implantation step to have substantially no effect on field oxide regions 56 or on N— wells 34 and 36 underlying these regions, except that etch rates of field oxide 56 may be slightly altered. Consequently, for the BICMOS process discussed above in connection with the preferred embodiment, a single mask 60 may be used for both an N type dopant channel stop implantation and an N type dopant deep collector implantation.

Figure 5:
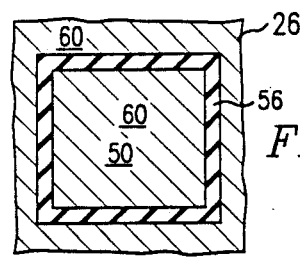
FIG. 5 shows a top view of a portion of the present invention at the fourth stage of fabrication.

FIG. 5 shows a top view of PMOS device 26 at the fourth stage of fabrication, which is also depicted in FIG. 4. As shown in FIG. 5, the N channel stop dopant is introduced so that the N channel stop region 64 (see FIG. 4), which underlies exposed portion of field oxide 56, completely surrounds moat area 50 of PMOS transistor 26. If multiple P moats reside in an N well, then region 64 is also implanted between adjacent ones of said P moats (not shown).

Figure 6:
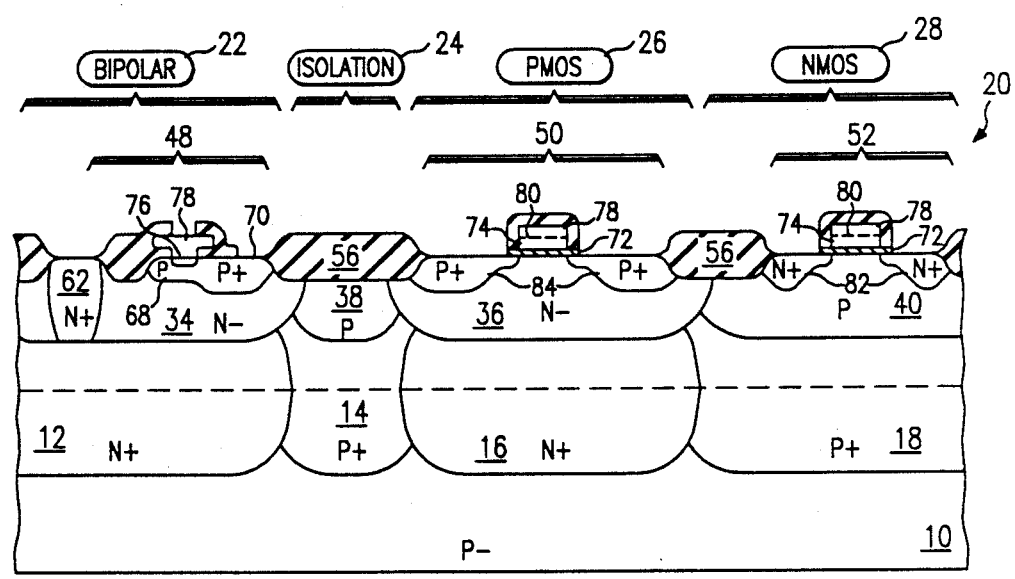
FIG. 6 shows a schematic cross-sectional side view of the present invention at a fifth stage of fabrication.

FIG. 6 shows a fifth stage in the fabrication of semiconductor device 20. After the fourth stage of fabrication of semiconductor device 20, device 20 is prepared for completion of bipolar transistor 22, PMOS transistor 26, and NMOS transistor 28. In addition, isolation region 24, which is buried beneath one of field oxide regions 56, is not altered so that no transistors are formed in well 38. Several steps may advantageously be required to progress the fabrication of device 20 from the stage depicted in FIGS. 4 and 5 to the stage depicted in FIG. 6. For example, the present process strips photoresist 60 (see FIG. 4), and a boron threshold implant is performed. This threshold implant lightly dopes moat regions 50 and 52 and base region 48 with boron. Next, a photoresist patterning and masking step occurs so that an intrinsic base region 68 of bipolar transistor 22 is implanted with P type dopant. This base implantation step masks off all of semiconductor device 20 except for base region 48 of bipolar transistor 22. Consequently, the intrinsic base implant is also introduced into an extrinsic base area 70. Another masking and patterning step occurs later, in conjunction with a PMOS source/drain pattern. This mask is the same used for P+ in the PMOS transistors.

Next, the photoresist layer (not shown) and dummy oxide layer 58 (see FIG. 4) are stripped. The present process thermally grows a gate oxide 72, which in the preferred embodiment achieves a thickness of less than around 250 angstroms. After the formation of gate oxide layer 72, a first polysilicon layer 74 is deposited. Polysilicon layer 74 in the preferred embodiment is deposited to a thickness of approximately 2,000 angstroms, and then patterned and etched to form the pattern for emitter 76 of bipolar transistor 22. This etching step additionally strips away gate oxide 72 overlying intrinsic base 68. Next, a second polysilicon layer 78 is deposited to a thickness of approximately 2,500 angstroms so that a total of 4,500 angstroms of polysilicon resides in moat areas 50 and 52 of PMOS and NMOS transistors 26 and 28, respectively. Polysilicon layers 74 and 78 are then implanted with N+ dopant, and patterned and etched so that emitter 78 and gates 80 are formed. Gates 80 reside in moats 50 and 52.

After formation of emitter 78 and gates 80, the present process forms sidewall oxides on emitter 78 and gates 80, and incorporates a photoresist deposition and development step to define a mask for implantation of N+ source/drain (S/D) regions 82 in moat 52 of NMOS transistor 28. Subsequently, a conventional implantation step implants phosphorous, or a combination* of phosphorous and arsenic, at a dosage of around 4E14/cm$^2$ phosphorous at 95 kev and 3E15/cm$^2$ arsenic at 150 Kev into P well 40 on opposing sides of the gate 80 in moat 52. In the preferred embodiment, the N+ S/D implantation step additionally adds N+ dopant in deep collector region 62 of bipolar transistor 22 to further increase the dosage of N+ dopant in that region. After implantation of N+ dopant in S/D regions 82, a similar process occurs for P+ regions 84 which reside in moat 50 of PMOS transistor 26 and extrinsic base 70 of transistor 22. Thus, a pattern step is performed to expose moat region 50 and an implantation of boron occurs. In the preferred embodiment of the present invention, boron is implanted at a dose of around 3E15/cm$^2$ and energy level of around 20 kev.

After the above implantation steps, an annealing cycle occurs to drive the N+ dopant from emitter 78 into intrinsic base 68, and to drive-in base regions 68 and 70 and S/D regions 82 and 84. Previous oxidation steps have substantially driven in deep collector region 62 so that a low resistance path from subcollector 12 to surface 32 is formed thereby. At this step in the process, semiconductor device 20 substantially resembles the structure shown in FIG. 6, and bipolar transistor 22, PMOS transistor 26, and NMOS transistor 28 are substantially formed. However, subsequent processing steps may apply a layer of TEOS oxide (not shown) overlying semiconductor device 20 and a phospho-silicate glass layer (not shown) overlying the TEOS layer.

Next, the preferred process may advantageously form holes through the TEOS and glass layers for contacts to gates 80, S/D regions 82 and 84, collector region 62, emitter 78, and extrinsic base 70. A metallization step may then occur, followed by a patterning and etching step. Finally, finishing passivation layers may be applied to semiconductor device 20, and bond pads opened through the passivating layer for bonding.

Consequently, a semiconductor device as depicted in FIGS. 1-6 consists of nonparasitic, active transistors 22, 26, and 28. In addition, semiconductor device 20 contains several parasitic transistors. However, transistors 22, 26, and 28 are sufficiently isolated from each other because these parasitic transistors do not significantly activate under normal operating conditions. For example, one parasitic transistor consists of N+ S/D region 82, P− well 40, and N− well 36. However, the boron channel stop implanted in P− well 40 ensures that P− well 40 does not invert under normal operating conditions. Other parasitic transistors are formed between the P+ moats or P doped bases and a P well 38 or 40. Such parasitic transistors have a P parasitic channel region. For example, P+ extrinsic base region 70, N− well 34 and P well 38 or P+ S/D region 84, N− well 36, and P well 40 represent such parasitic transistors having P parasitic channels.

The N type dopant channel stop implanted as discussed above compensates the P type dopant which was implanted in N− wells 34 and 36. This compensation ensures that parasitic transistors having P parasitic channels do not activate under normal operating conditions. Additional parasitic transistors exist between N wells with intervening P wells possibly having N type parasitic channels. However, the channel stop dopants and geometry of semiconductor device 20 ensure that such well to well parasitic transistors will not activate under normal operating conditions. In summary, semiconductor device 20 is fabricated by a process which isolates active transistors from one another without increasing the number of masking steps required for BICMOS fabrication, and the present invention combines a mask used for a deep collector implantation step with the mask used for an N type dopant channel stop implantation step.

The present invention has been described above with reference to a preferred embodiment. However, those skilled in the art will recognize that changes and modifications may be made in this preferred embodiment without departing from the scope of the present invention. For example, the dimensions, concentrations, dosages, and energy levels discussed above are presented to illustrate the preferred embodiment and are not believed to be critical features in the present invention. Moreover, the precise orientation of diverse type transistors need not be as indicated in the FIGURES. Thus, any of a bipolar transistor, PMOS transistor, and NMOS transistor may reside adjacent to another one of a bipolar, PMOS, or NMOS transistor so long as N− wells are isolated from one another by a P well. In other words, by referring to FIG. 6, NMOS transistor 28 could alternatively be fabricated in well 38 between bipolar transistor 22 and PMOS transistor 26 rather than as shown in FIG. 6. However, in this situation, P well 38 would need to be larger than is shown in the FIGURES. These and other changes and modifications which are obvious to those skilled in the art are intended to be included within the scope of the present invention.

What is claimed is:

1. A method of manufacturing a semiconductor device in a substrate having semiconductor surface areas thereon, said method comprising the steps of:
   forming a first well region of a first conductivity type in said substrate at one of said surface areas;
   forming a second well region of a second conductivity type in said substrate at said one area, adjacent to said first well;
   introducing a first dopant of said first conductivity type into said first and second well regions;
   forming a field insulating region overlying first portions of said first and second well regions at said one area; and
   introducing a second dopant of said second conductivity type through said field insulating region into said first portion of said second well region.

2. A method as claimed in claim 1 additionally comprising the step of selecting said first conductivity type in said first well region to be P type and said second conductivity type in said second well region to be N type.

3. A method as claimed in claim 2 additionally comprising the step of selecting said first conductivity type dopant to be substantially boron and said second conductivity type dopant to be substantially phosphorous.

4. A method as claimed in claim 1 additionally comprising the steps of:
   identifying first and second moat regions at said one area within said first and second well regions, respectively; and
   blocking introduction of said first and second dopants into said first and second moat regions.

5. A method as claimed in claim 4 additionally comprising the step of forming an NMOS transistor in said first moat region and a PMOS transistor in said second moat region.

6. A method as claimed in claim 1 additionally comprising the steps of:
   forming a PMOS transistor in said second well region; and
   refraining from forming a transistor in said first well region so that said first well region serves as a buried isolation region.

7. A method as claimed in claim 1 additionally comprising the step of preventing said second dopant from being introduced into said first well region.

8. A method as claimed in claim 7 wherein said field insulating region does not overlie a second portion of said second well region, and said method additionally comprises the step of introducing said second dopant into said second portion of said second well region.

9. A method as claimed in claim 8 additionally comprising the step of introducing a third dopant of said second conductivity type into said semiconductor device at said second well region so that said third dopant is substantially contained within said field insulating region overlying said first portion of said second well region.

10. A method as claimed in claim 9 wherein said second dopant is introduced at a first predetermined dosage, and said method additionally comprises the step of selecting a dosage for application of said third dopant to be greater than said first predetermined dosage.

11. A method as claimed in claim 10 additionally comprising the step of forming a bipolar transistor in said second well so that said substrate at said second portion thereof serves as a deep collector region for said bipolar transistor.

12. A method as claimed in claim 11 additionally comprising the step of forming an NMOS transistor in said first well region.

13. A method as claimed in claim 11 additionally comprising the step of refraining from forming a transistor in said first well region so that said first well region serves as a buried isolation region.

14. A method as claimed in claim 1 wherein said introducing steps implant said first and second conductivity type dopants, and said method additionally comprises the step of selecting the energy level used to implant said second dopant so that a significant portion of said second dopant resides at a boundary between said field insulating region and said one area of said substrate.

15. A method as claimed in claim 14 additionally comprising the step of selecting a dosage used in connection with implanting said second dopant relative to a dosage used in connection with implanting said first dopant so that a concentration of said first dopant at said boundary between said field insulating region and said one area of said substrate is less than a concentration of said second dopant at said junction between said field insulating region and said one area of said substrate.

16. A method of manufacturing a BICMOS semiconductor device in a substrate having semiconductor surface areas thereon, said method comprising the steps of:
   forming a P type well region in said substrate at one of said surface areas;
   forming an N type well region in said substrate adjacent to said P type well region at said one area;
   introducing a P type dopant into said P type and N type well regions;
   forming a field insulating region overlying first portions of said P type and N type well regions at said one area and not overlying a second portion of said N type well region;
   introducing a first N type dopant through said field insulating region into said first portion of said N type well region;
   preventing introduction of said first N type dopant into said P type well region; and
   introducing a second N type dopant into said semiconductor device at said N type well region so that said second N type dopant resides in said second portion of said N type well region and so that said second dopant is substantially contained within said field insulating region overlying said first portion of said N type well region.

17. A method as claimed in claim 16 additionally comprising the step of selecting dosages for application of said first and second N type dopants so that said second N type dopant dosage is greater than said first N type dopant dosage.

18. The method as claimed in claim 17 additionally comprising the step of forming a bipolar transistor in said N type well so that said second portion of said N type well serves as a deep collector region for said bipolar transistor.

19. A method as claimed in claim 18 additionally comprising the step of forming an NMOS transistor in said P type well region.

* * * * *